United States Patent
Song et al.

(10) Patent No.: US 10,959,306 B2
(45) Date of Patent: Mar. 23, 2021

(54) DIMMING LED CIRCUIT AUGMENTING DC/DC CONTROLLER INTEGRATED CIRCUIT

(71) Applicant: Lumileds LLC, San Jose, CA (US)

(72) Inventors: Zhihua Song, San Jose, CA (US); Wouter Soer, San Jose, CA (US); Ron Bonne, San Jose, CA (US); Yifeng Qiu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 283 days.

(21) Appl. No.: 15/606,388

(22) Filed: May 26, 2017

(65) Prior Publication Data

US 2018/0035500 A1    Feb. 1, 2018

Related U.S. Application Data

(60) Provisional application No. 62/367,984, filed on Jul. 28, 2016.

(30) Foreign Application Priority Data

Sep. 29, 2016  (EP) .................................... 16191428

(51) Int. Cl.
*H05B 45/37* (2020.01)
*H05B 45/10* (2020.01)
(Continued)

(52) U.S. Cl.
CPC ........... *H05B 45/37* (2020.01); *H03G 1/0005* (2013.01); *H05B 39/041* (2013.01); *H05B 45/10* (2020.01);
(Continued)

(58) Field of Classification Search
CPC ...................... H05B 33/0815; H05B 33/0851; H05B 37/02; H05B 45/37; H05B 45/3725;
(Continued)

(56) References Cited

U.S. PATENT DOCUMENTS 8,564,370 B2  10/2013  Yinn et al.
9,232,606 B2  1/2016  Kuang
(Continued)

FOREIGN PATENT DOCUMENTS

CN   103378238 A   10/2013
CN   110235522 A   9/2019
(Continued)

OTHER PUBLICATIONS

Adragna, "L6561, Enhanced Transition Mode Power Factor Corrector," STMicroelectronics, Application Note—AN966 (Mar. 2003).
(Continued)

*Primary Examiner* — Alexander H Taningco
*Assistant Examiner* — Pedro C Fernandez
(74) *Attorney, Agent, or Firm* — Schwegman Lundberg & Woessner, P.A.

(57) ABSTRACT

Embodiments include systems, methods, and apparatuses for providing a dimming function in a single stage AC input light emitting diode (LED) driver with a controller that contains an on-chip error amplifier and an on-chip fixed reference voltage source coupled to a first input of the error amplifier. The controller controls a duty cycle of a switching transistor to cause a feedback voltage, applied to a first package input terminal, to match the reference voltage. To achieve a dimming function, a voltage across a current sense resistor in series with the LEDs is applied to a first input of a high gain differential amplifier, and a variable dimming control voltage is applied to a second input of the differential amplifier. The output of the differential amplifier is coupled to the first package input terminal. The differential amplifier input signals will be matched at the target LED current level.

15 Claims, 7 Drawing Sheets

(51) Int. Cl.
- *H05B 45/20* (2020.01)
- *H05B 47/10* (2020.01)
- *H03G 1/00* (2006.01)
- *H05B 39/04* (2006.01)

(52) U.S. Cl.
CPC .............. *H05B 45/20* (2020.01); *H05B 47/10* (2020.01); *Y02B 20/30* (2013.01)

(58) Field of Classification Search
CPC .... H05B 45/375; H05B 45/38; H05B 45/382; H05B 45/385; H05B 45/39; H05B 45/392; H05B 45/10; H05B 45/20; H05B 47/10; H03G 1/0005
See application file for complete search history.

(56) References Cited

U.S. PATENT DOCUMENTS

| | | | |
|---|---|---|---|
| 9,345,083 B2 | 5/2016 | Hussain et al. | |
| 2012/0146545 A1 | 6/2012 | Nerone | |
| 2012/0188487 A1* | 7/2012 | Hagino | H05B 33/0812 349/69 |
| 2013/0270514 A1 | 10/2013 | Saxler | |
| 2014/0009077 A1 | 1/2014 | Yoshimoto et al. | |
| 2014/0252974 A1 | 9/2014 | Kim et al. | |
| 2015/0145439 A1* | 5/2015 | Szolusha | H05B 45/37 315/307 |
| 2015/0334800 A1 | 11/2015 | Fawaz et al. | |

FOREIGN PATENT DOCUMENTS

| | | |
|---|---|---|
| JP | 55118628 | 9/1980 |
| JP | 09162444 A | 6/1997 |
| JP | 2003068745 A | 3/2003 |
| JP | 2006073815 A | 3/2006 |
| JP | 2007042944 A | 2/2007 |
| JP | 2008543045 A | 11/2008 |
| JP | 2012156326 A | 8/2012 |
| JP | 2014154808 A | 8/2014 |
| JP | 2015084616 A | 4/2015 |
| JP | 2015162631 A | 9/2015 |
| JP | 2016119830 A | 6/2016 |
| JP | 2019523535 A | 8/2019 |
| KR | 20190032561 A | 3/2019 |
| TW | 201532022 A | 8/2015 |
| WO | 2013/016355 | 1/2013 |
| WO | WO-2018022181 A1 | 2/2018 |

OTHER PUBLICATIONS

STMicroelectronics, "Transition-Mode PFC Controller," L6562 (Nov. 2005).
"European Application Serial No. 17834906.4, extended European Search Report dated Jun. 25, 2019", 14 pgs.
"European Application Serial No. 17834906.4, Office Action dated Dec. 7, 2019", 1 pg.
"European Patent Application Serial No. 17834906.4, Reply filed Dec. 18, 2019 to Office Action dated Dec. 7, 2019", 44 pgs.
"International Application Serial No. PCT/US2017/034662, International Preliminary Report on Patentability dated Feb. 7, 2019", 7 pgs.
"International Application Serial No. PCT/US2017/034662, International Search Report dated Aug. 14, 2017", 2 pgs.
"International Application Serial No. PCT/US2017/034662, Written Opinion dated Aug. 14, 2017", 5 pgs.
"Japanese Application Serial No. 2018-560947, Notification of Reasons for Rejection dated Dec. 10, 2019", (w/ English Translation), 14 pgs.
"Japanese Application Serial No. 2019-504690, Notification of Reasons for Refusal dated Dec. 10, 2019", (w/ English Translation), 10 pgs.
"Korean Application Serial No. 10-2019-7005899, Notice of Preliminary Rejection dated Feb. 17, 2020", (w/ English Translation), 10 pgs.
"Japanese Application Serial No. 2019-504690, Notification of Reasons for Refusal dated Jun. 23, 2020", with English Translation, 10 pgs.
"Korean Application Serial No. 10-2019-7005899, Response filed Apr. 28, 2020 to Notice of Preliminary Rejection dated Feb. 17, 2020", with English Claims, 17 pgs.
"Taiwanese Application Serial No. 106117744, Office Action dated Nov. 24, 2020", (w/ English Translation), 16 pgs.
"Japanese Application Serial No. 2019-504690, Written Argument and Amendment filed Dec. 21, 2020 to Notification of Reasons for Refusal dated Jun. 23, 2020", (w/ English Translation), 13 pgs.
"Taiwanese Application Serial No. 106117744, Response filed Jan. 14, 2021 to Office Action dated Nov. 24, 2020", (w/ English Translation), 30 pgs.

* cited by examiner

DIMMING LED CIRCUIT AUGMENTING DC/DC CONTROLLER INTEGRATED CIRCUIT

CROSS REFERENCE TO RELATED APPLICATIONS

This application claims the benefit of U.S. Provisional Application No. 62/367,984 filed on Jul. 28, 2016 and European Patent Application No. 16191428.8 filed on Sep. 29, 2016, the contents of which are hereby incorporated by reference herein.

GOVERNMENT LICENSE RIGHTS

This invention was made with U.S. Government support under Contract No. DE-EE0006703 awarded by the Department of Energy (DOE). The Government has certain rights in this invention.

BACKGROUND

The ability to dim light emitting diodes (LEDs) is an important feature in many of today's solid state lighting applications. Unlike conventional incandescent bulbs, which may be dimmed using pulses of voltage, an LED is a very different load. First, the LED needs to be driven by a current source rather than a voltage source. While this is not difficult in itself, it does require a different supply design. Second, and much more difficult, the LED is a diode-like, highly non-linear load, even more complicated than just a simple reactive (capacitive or inductive) load. One way to way to dim the LED is to reduce its drive or current.

SUMMARY

Embodiments include systems, methods, and apparatuses for driving and dimming one or more light emitting diodes (LEDs). In an embodiment, a module may include a resistor connected to a cathode end of one or more LEDs and a ground. A voltage across the resistor may be proportional to a current through the one or more LEDs. The module may include a differential amplifier. A first input of the differential amplifier may be coupled to the voltage across the resistor and a second input of the differential amplifier may be coupled to a variable dimming voltage controlled by a user. The module may include a controller for regulating an output voltage supplied to an anode end of the one or more LEDs. The controller may include an error amplifier having a first input coupled to a fixed internal reference voltage and a second input coupled to an output voltage of the differential amplifier. The module may include a switching transistor coupled to the controller. The controller may turn the switching transistor on and off based on an output of the differential amplifier to vary the output voltage and the current through the one or more LEDs. This may adjust the brightness of the one or more LEDs.

BRIEF DESCRIPTION OF THE DRAWINGS

A more detailed understanding may be had from the following description, given by way of example in conjunction with the accompanying drawings wherein.

DETAILED DESCRIPTION

Figure 1:
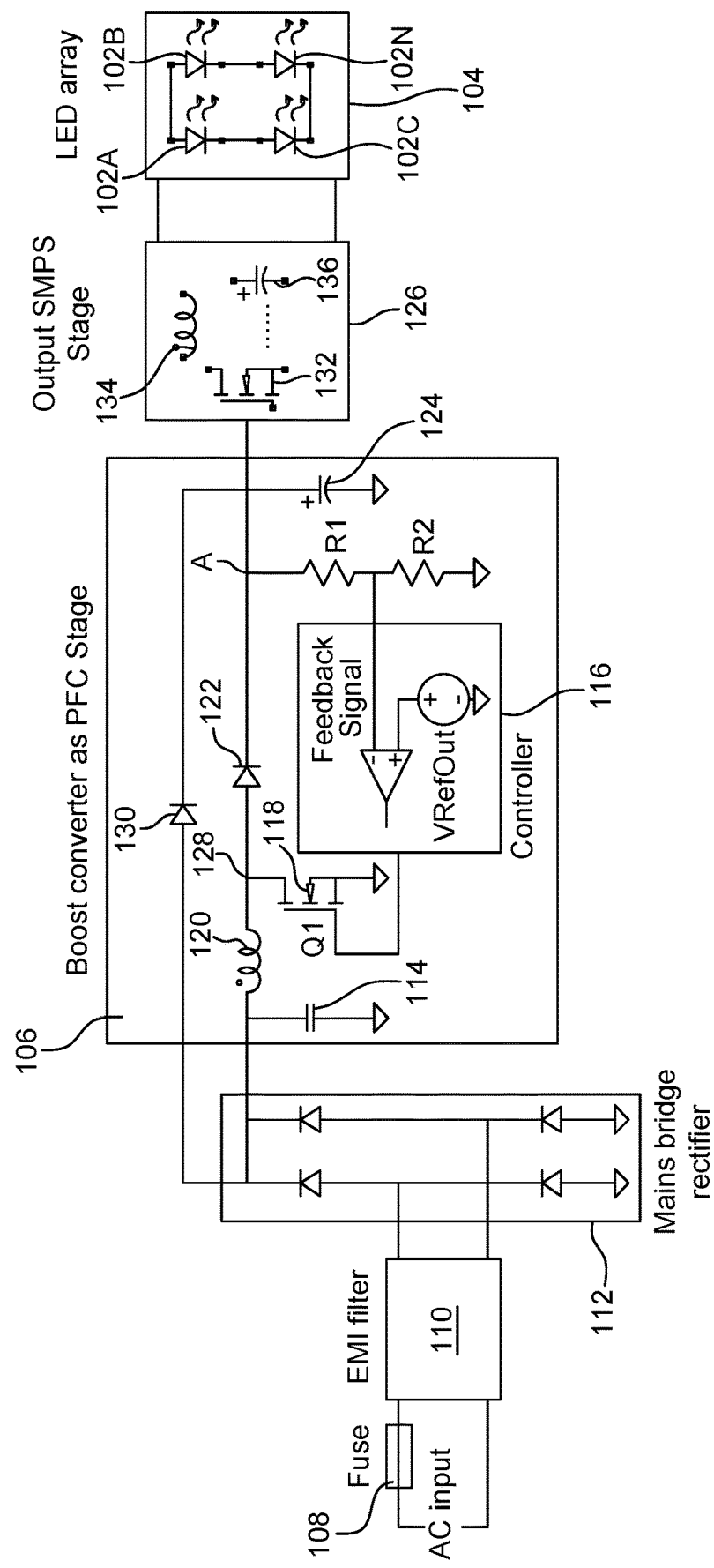
FIG. 1 is a circuit diagram of a 2-stage AC input light emitting diode (LED) driver.

In the following description, numerous specific details are set forth, such as particular structures, components, materials, dimensions, processing steps, and techniques, in order to provide a thorough understanding of the present embodiments. However, it will be appreciated by one of ordinary skill of the art that the embodiments may be practiced without these specific details. In other instances, well-known structures or processing steps have not been described in detail in order to avoid obscuring the embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments described herein.

In some light emitting diode (LED) lighting applications, it may be desirable to have a dimming capability, where the user is able to control the brightness of the LEDs. Conventional LED drivers may include a dimming function, but these drivers may not be appropriate for a particular application and/or may not have certain desired features.

For example, an LED module that uses a rectified AC mains voltage as the power source may be connected to about 150 LEDs in series, which may result in a voltage drop of over 450 V. A boost converter may be used to step up the rectified voltage to over 450 V in conjunction with a self-oscillating switching circuit (i.e., no oscillator used). Accordingly, a general purpose (non-LED) off-the-shelf boost converter controller IC using self-oscillation may be the preferred choice of controller to use in the boost converter for economic reasons. However, because an internal reference voltage reference applied to an internal error amplifier may be a fixed reference voltage, a general purpose boost converter controller IC may not have a dimming capability. Accordingly, it may be desirable to design a LED driver using a conventional controller that also has a dimming function.

Referring now to FIG. 1, a circuit diagram of a 2-stage AC input LED driver is shown. A boost converter 106 may be used as a power factor correction (PFC) in a 2-stage switching mode power supply (SMPS) to achieve a high quality input current to drive one or more (e.g., 158) LEDs 102A-102N in a LED array 104. Each of the one or more LEDs 102A-102N may be a blue-emitting GaN-based LED and may drop about 3 volts. Therefore, the boost converter 106 may boost a rectified AC mains voltage to, for example, 474 V. A phosphor may convert the blue LED light to white light for general illumination. The boost converter 106 may also maintain a stable output voltage irrespective of variation of input voltage and output load.

The AC mains voltage may be applied, via a fuse 108, to an EMI filter 110. A full diode bridge of a mains bridge rectifier 112 may rectify the AC voltage and an input capacitor 114 may at least partially filter the rectified AC voltage. A controller 116 may turn on a switching transistor 118 and a right end of an inductor 120 may be pulled to ground for charging the inductor 120. The controller 116 may be a conventional transition-mode PFC controller. The controller 116 may be an integrated circuit (IC) configured to control PFC pre-regulators by using a transition mode technique.

The controller 116 may be used for a boost mode, a buck mode, or a buck-boost mode converter.

At a particular time in the switching cycle to generate a target current through the one or more LEDs 102A-102N, the switching transistor 118 may be turned off. This may result in the voltage at the right end of the inductor 120 rising to forward bias a diode 122. This may recharge an output capacitor 124, which may smooth the waveform and essentially supply a DC voltage to an output at a regulated current to an output SMPS stage 126.

The switching transistor 118 may switch on and off at a relatively high frequency, such as approximately 10 kHz to approximately 1 MHz. The switching transistor 118 may couple a right end of an inductor 120 to either a ground or a positive voltage at the high frequency to generate the boosted output voltage. The switching transistor 118 may be a metal-oxide-semiconductor field-effect transistor (MOSFET) or a bipolar transistor that carries a steep slope voltage waveform, which may be a square wave voltage, at the switching frequency.

It should be noted that the term "square wave," as used herein, does not require the waveform to have rectangular pulses. Neither does it require the waveform to have a duty cycle of 50% (i.e., having equal durations of high and low levels). In some applications, non-instantaneous switching and parasitic effects may result in non-rectangular waveforms. Accordingly, the term "square wave" means a switched voltage that swings between a high level and low level as a result of a switching transistor being turned on and off at times to achieve a target output voltage or current.

Accordingly, the high frequency square wave voltage may be generated with a relatively high voltage (e.g., up to 500 V), and a relatively large average current (e.g., up to 1 Amp). The output capacitor 124 may be used to somewhat filter the ripple to supply a regulated DC current. In one example, the square wave voltage may rapidly transition between ground and about 500 V. A drain node 128 of the switching transistor 118 may carry the square wave voltage. Any high frequency ripple in the current supplied may be acceptable since any high frequency ripple may not be perceived, as long as the peak current stays within the current rating of the one or more LEDs 102A-102N.

A separate diode-coupled path containing a diode 130 may exist between the mains bridge rectifier 112 and the output capacitor 124. The separate diode-coupled path may provide for a fast partial charge up upon start-up.

The output SMPS stage 126 may include at least a switching transistor 132, a magnetic component 134 and a capacitor 136. The output SMPS state 126 may convert the output voltage of the boost converter 106 into a current to drive the LED array 104.

As shown in FIG. 1, voltage feedback in the 2-stage AC input LED driver may be a negative feedback system. A divided resistor, made up of a first resistor R1 and a second resistor R2 may be connected as a feedback signal to sense the boost converter output voltage at node A. The booster converter output voltage may be compared to a fixed reference voltage $V_{Refout}$ in the controller 116. By controlling the gate voltage of the switching transistor 118, the voltage input into the controller 116 may be regulated to be essentially same as $V_{Refout}$. This may result in A-node voltage that is regulated to the required level.

The 2-stage AC input LED driver may have good performance characteristics, but it may suffer from disadvantages of relatively high cost, low efficiency, large form factor, and increased design complexity.

Figure 2:
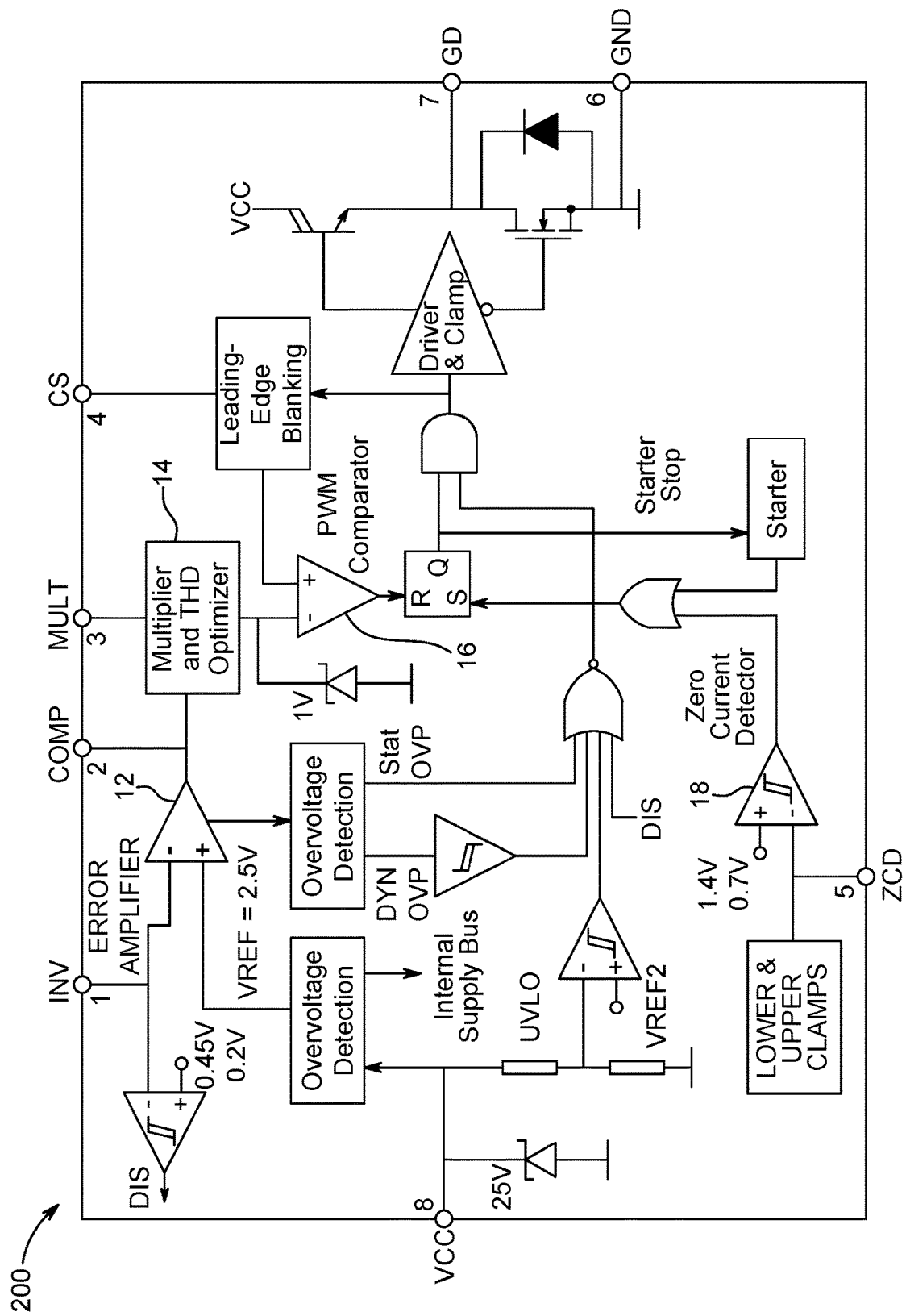
FIG. 2 is a block diagram illustrating a controller integrated circuit (IC)

Referring now to FIG. 2, a block diagram illustrating a controller 200 is shown. The controller 200 may be a conventional PFC controller built on an integrated circuit (IC) and may be used as the controller 116 as shown in FIG. 1. The controller 200 may include one or more pins connecting it to the LED module.

An inverting input (INV) pin 1 may invert an input of an error amplifier 12. Information on an output voltage of a PFC pre-regulator may be fed into the INV pin 1 through a resistor divider.

A compensation (COMP) pin 2 may be connected to an output of the error amplifier 12. A compensation network (not shown) may be placed between this pin and the INV pin 1 to achieve stability of a voltage control loop and ensure a high power factor and low total harmonic distortion (THD).

A multiplier (MULT) pin 3 may be a main input to a multiplier 14. The MULT pin 3 may be connected to the mains voltage via a resistor divider (not shown) and may provide a sinusoidal reference to a current loop.

A current sense (CS) pin 4 may be an input to a pulse width modulator (PWM) comparator 16. Current flowing through the switching transistor 118 may be sensed through a resistor. The resulting voltage may be applied to this pin and compared with an internal sinusoidal-shaped reference, which may be generated by the multiplier 14. This may be used to determine the turn-off of an external power transistor.

A zero crossing detector (ZCD) pin 5 may boost a demagnetizing sensing input of the inductor 120 for transition-mode operation. A negative-going edge may trigger the turn-on of the external power transistor.

A ground (GND) pin 6 may act as a current return for the signal part of the controller 200 and a gate driver.

A gate driver (GD) pin 7 may be a gate driver output. A totem pole output stage may be able to drive the external power transistor with a peak current of approximately 600 mA source and 800 mA sink. The high-level voltage of this the GD pin 7 may be capped at approximately 12 V to avoid excessive gate voltages in case it is supplied with a high supply voltage ($V_{cc}$).

A $V_{cc}$ pin 8 may be the supply voltage of the signal part of the controller 200 and the gate driver. The supply voltage upper limit may be extended to 22 V min. to provide additional headroom for supply voltage changes.

The GD pin 7 may be connected to the gate of the external power transistor, which may be the switching transistor 118 as shown in FIG. 1. The external power transistor may be connected to a suitable output circuit for generating a regulated voltage or current. The current through the external power transistor (and an inductor) may be sensed and a current feedback signal may be applied to the CS pin 4.

A divided output voltage may be fed back into the error amplifier 12 via the INV pin 1. The divided output voltage may be the R2 voltage as described above with reference to FIG. 1. A non-inverting input of the error amplifier 12 may be coupled to an internal reference voltage $V_{ref}$, which may be fixed at 2.5 volts. The multiplier 14 may be used to modulate the output of the error amplifier 12, which may be compensated by an external capacitor connected to the COMP pin 2, by a sinusoidal rectified AC mains voltage (e.g., 120 Hz). The sinusoidal rectified AC mains voltage may be used as the input voltage for the PFC stage 106 as shown in FIG. 1. The PWM comparator 16 may compare the current signal at the high switching frequency, such as 14 kHz, to the output of the multiplier 14 to reset (i.e., turn off) the external power transistor during each switching cycle to achieve regulation.

The voltage and current feedback loops may cause the two inputs into the error amplifier 12 to match. The external power transistor may be turned back on when a zero current detector 18 detects that the current through the inductor 120 in FIG. 1 is approximately zero to reduce switching losses.

As with other conventional controllers, the error amplifier 12 is internal to the IC and the internal reference voltage is fixed. Accordingly, the controller 200 may not be able to drive series-connected LEDs using a dimming controller, since the error amplifier 12 compares the divided output voltage to a fixed 2.5 volt reference. An LED driver that uses this control but has a dimming function may be desirable.

Figure 3:
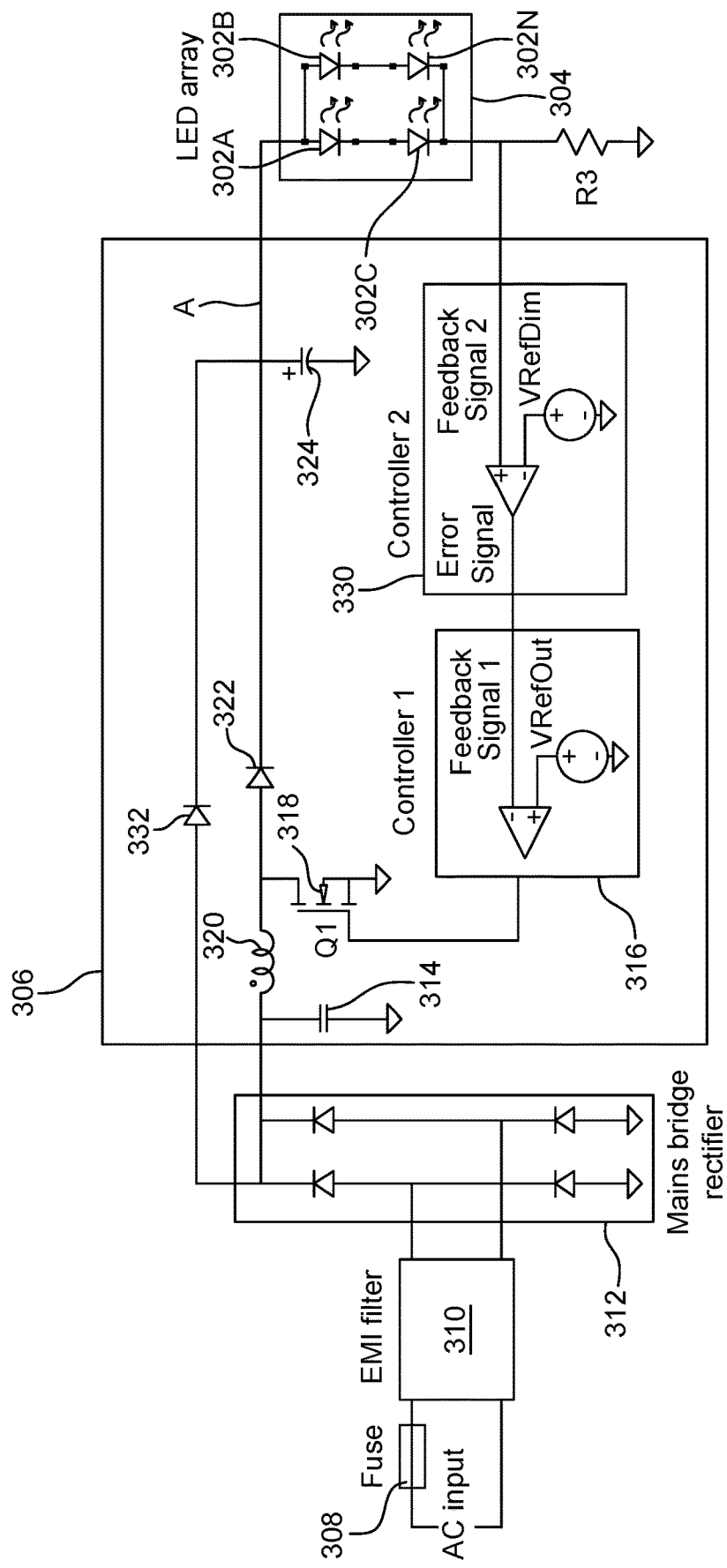
FIG. 3 is a circuit diagram of a single stage AC input boost converter to directly drive and dim LEDs.

Referring now to FIG. 3, a circuit diagram of a single stage AC input boost converter to directly drive and dim LEDs is shown. The single stage circuit may use a boost converter as both the PFC stage and output stage to drive the LED array. The LED array may be directly connected to boost output. Unlike the 2-stage AC input LED driver shown in FIG. 1, no additional output SMPS stage (as shown as output SMPS stage 126) is needed. As described below, the average output voltage control of the boost converter may be changed to average output current control to control the LED current for dimming purposes.

A single stage boost converter 306 may be used as the PFC and the output stage to achieve a high quality input current to drive one or more (e.g., 158) LEDs 302A-302N in series in a LED array 304. Each of the one or more LEDs 302A-302N may be a blue-emitting GaN-based LED and may drop about 3 volts. Therefore, the boost converter 306 may boost a rectified AC mains voltage to at least 474 V to drive the one or more LEDs 302A-302N. A phosphor may convert the blue LED light to white light for general illumination. The boost converter 306 may also maintain a stable output voltage irrespective of variation of input voltage and output load.

The AC mains voltage may be applied, via a fuse 308, to an EMI filter 310. A full diode bridge of a mains bridge rectifier 312 may rectify the AC voltage and an input capacitor 314 may at least partially filter the rectified AC voltage. A first controller 316 and a second controller 330 may operate together to turn on a switching transistor 318 and a right end of an inductor 320 may be pulled to ground for charging the inductor 320. The first controller 316 may be similar to the controller 116 described above with reference to FIG. 1.

At a particular time in the switching cycle to generate a target current through the one or more LEDs 302A-302N, the switching transistor 318 may be turned off. This may result in the voltage at the right end of the inductor 320 rising to forward bias a diode 322. This may recharge an output capacitor 324, which may smooth the waveform and essentially supply a DC voltage at a regulated current to the one or more LEDs 302A-302N.

The switching transistor 318 may switch on and off at a relatively high frequency, such as approximately 10 kHz to approximately 1 MHz. The switching transistor 318 may couple a right end of an inductor 320 to either a ground or a positive voltage at the high frequency to generate the boosted or output voltage. The switching transistor 318 may be a metal-oxide-semiconductor field-effect transistor (MOSFET) or a bipolar transistor that carries a steep slope voltage waveform, which may be a square wave voltage, at the switching frequency.

A separate diode-coupled path containing a diode 332 may exist between the mains bridge rectifier 312 and the output capacitor 324. The separate diode-coupled path may provide for a fast partial charge up upon start-up. Upon start-up, the output capacitor 324 voltage may be less than the rectified mains voltage. The forward biasing of the diode 332 may quickly charge the output capacitor 324 to the rectified mains voltage. Thereafter, the voltage across the output capacitor 324 may be increased to the regulated level and the diode 332 may become reverse biased.

Voltage feedback in the single stage boost converter 306 may be based on an output current of the LED array 304. As shown in FIG. 3, the divided resistor made up of R1 and R2 has been changed to a resistor R3, which is connected to the LED array 304 and senses the LED array current. The R3 voltage may be used as feedback signal of the second controller 330. The R3 voltage may be compared to a variable reference voltage $V_{RefDim}$. The $V_{RefDim}$ may vary with a dimming command, which may be input through any conventional means, such as a dial, knob, or digital input. The higher the value of $V_{RefDim}$, the higher the current required from the boost converter 306.

The second controller 330 may output an error signal as an input to the first controller 316. The error signal may represent the difference between the R3 voltage and the $V_{RefDim}$. The first controller 316 may use the error signal as a feedback signal to be compared to VRefOut, which may be a fixed reference voltage. By controlling the gate voltage of the switching transistor 318, the R3 voltage may be regulated to be essentially the same as $V_{RefDim}$. This may regulate the LED current to a required level. As $V_{RefDim}$ varies with a dimming command, the LED current will change, and the LED array 304 may be dimmed as required.

Because of the high output voltage of the boost converter 306, the LED array 304 may have a high total forward voltage. This may help improve circuit efficiency due to lower current and circuit losses. Depending on the application requirements, high-voltage (multi-junction) LEDs may be used in the LED array 304 to reduce the number of LEDs needed to achieve the high total forward voltage. The single stage AC input boost converter may be used in different configurations to directly drive and dim LEDs.

Figure 4:
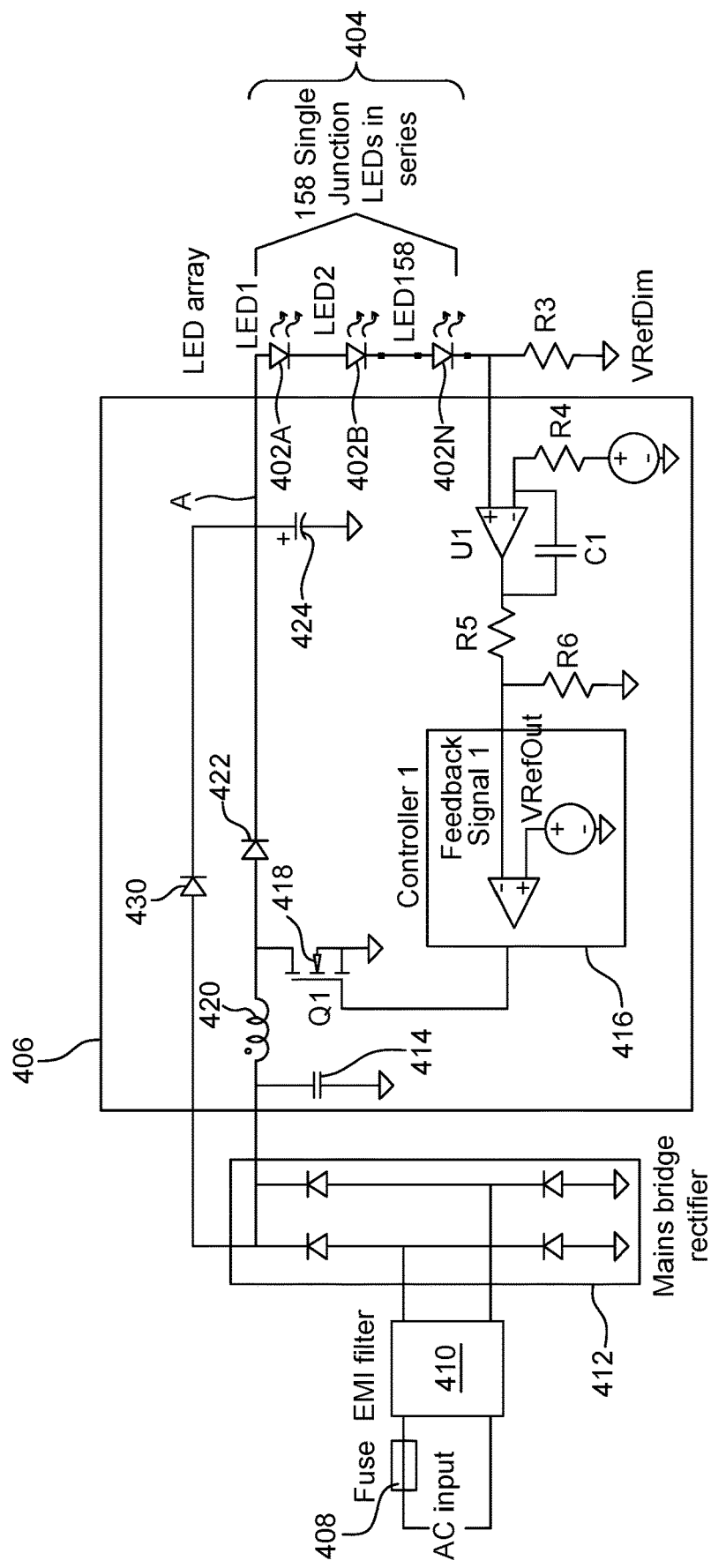
FIG. 4 is a circuit diagram of a single stage AC input boost converter that uses a universal 120-277 V AC input voltage to directly drive and dim one or more LEDs.

Referring now to FIG. 4, a circuit diagram of a single stage AC input boost converter 406 that uses a universal 120-277 V AC input voltage to directly drive and dim one or more LEDs 402A-402N is shown.

A single stage boost converter 406 may be used as the PFC and the output stage to achieve a high quality input current as well as to drive one or more (e.g., 158) LEDs 402A-402N. The one or more LEDs 402A-402N may be single junction LEDs and may be connected in series. Alternatively, the one or more LEDs 402A-402N may be multi-junction LEDs connected in series.

Each of the one or more LEDs 402A-402N may be a blue-emitting GaN-based LED. Each single junction LED may drop about 3 volts, thus 158 LEDs in series may drop 474 V. Therefore, the boost converter 406 may boost a rectified AC mains voltage to approximately 474 V to drive the one or more LEDs 402A-402N. A phosphor may convert the blue LED light to white light for general illumination. The boost converter 406 may also maintain a stable output voltage irrespective of variation of input voltage and output load.

The AC mains voltage may be applied, via a fuse 408, to an EMI filter 410. A full diode bridge of a mains bridge rectifier 412 may rectify the AC voltage and an input capacitor 414 may at least partially filter the rectified AC voltage. A controller 416 turn on a switching transistor 418 and a right end of an inductor 420 may be pulled to ground for charging the inductor 420. The controller 416 may be similar to the controller 116 described above with reference to FIG. 1.

At a particular time in the switching cycle to generate a target current through the one or more LEDs 402A-402N, the switching transistor 418 may be turned off. This may result in the voltage at the right end of the inductor 420 rising to forward bias a diode 422. This may charge an output capacitor 424, which may smooth the waveform and essentially supply a DC voltage at a regulated current to the one or more LEDs 402A-402N.

The switching transistor 418 may switch on and off at a relatively high frequency, such as approximately 10 kHz to approximately 1 MHz. The switching transistor 418 may couple a right end of an inductor 420 to either a ground or a positive voltage at the high frequency to generate the boosted or decreased output voltage. The switching transistor 418 may be a metal-oxide-semiconductor field-effect transistor (MOSFET) or a bipolar transistor that carries a steep slope voltage waveform, which may be a square wave voltage, at the switching frequency.

A separate diode-coupled path containing a diode 430 may exist between the mains bridge rectifier 412 and the output capacitor 424. The separate diode-coupled path may provide for a fast partial charge up upon start-up. Upon start-up, the output capacitor 424 voltage may be less than the rectified mains voltage. The forward biasing of the diode 430 may quickly charge the output capacitor 424 to the rectified mains voltage. Thereafter, the voltage across the output capacitor 424 may be increased to the regulated level and the diode 430 may become reverse biased.

Voltage feedback in the single stage boost converter 406 may be based on an output current of the LED array 404. An operational amplifier U1 may be used to amplify a difference between R3 voltage representing the current through the one or more LEDs 402A-402N and a VRefDim representing a dimming command or level. The output of the operational amplifier U1 may be scaled down via a resistor divider R5/R6 and then connected as the feedback signal of the controller 416. A capacitor C1 may be used as frequency compensation for the operational amplifier U1.

Figure 5:
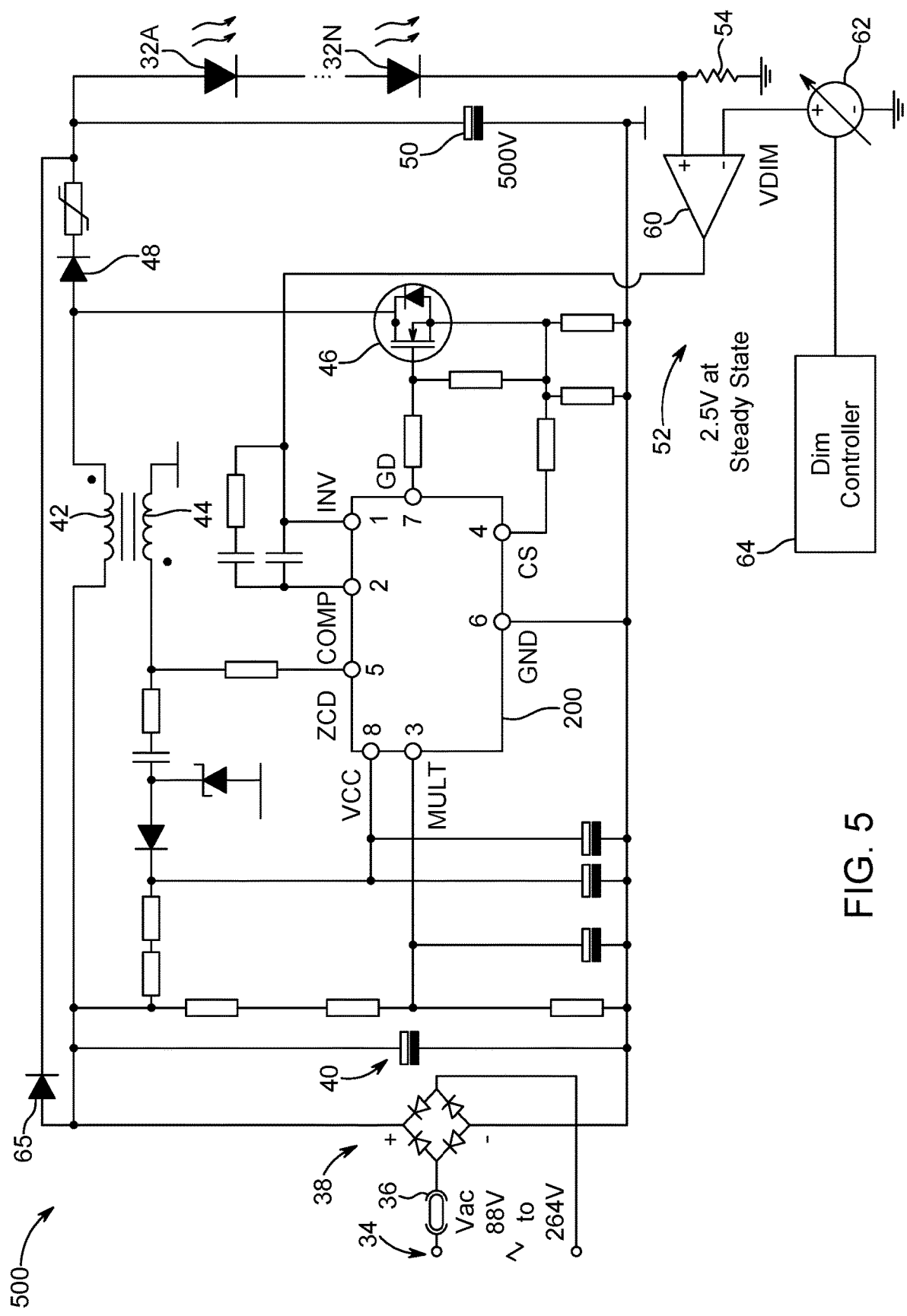
FIG. 5 is a circuit diagram of a single stage AC input boost converter configured with a controller and a first dimming circuit.

Referring now to FIG. 5, a circuit diagram of a single stage AC input boost converter 500 configured with the controller 200 and a first dimming circuit 52 is shown. The circuit diagram may illustrate aspects of a typical application circuit that produces a driving current based on an input of a wide-range mains voltage. It should be noted that well-known structures, including one or more resistors, diodes, and capacitors, and processing steps have not been described in detail in order to avoid obscuring the embodiments described herein.

The single stage AC input boost converter 500 directly drive and dim a series string of LEDs 32A-32N. The series string of LEDs 32A-32N may be 158 LEDs in series, each dropping around 3 volts. The single stage AC input boost converter 500 may generate, for example, 474 V. Multi-junction LEDs may instead be used. As shown in FIG. 2, the controller 200 may be an IC having an on-chip error amplifier and an internal fixed voltage reference coupled to an input of the error amplifier. The controller 200 is not typically used for supplying a dimmable control for LEDs.

Voltage feedback in the single stage AC input boost converter 500 may be provided by a differential amplifier 60 and a dimming controller 64. The series string of LEDs 32A-32N may be driven by the regulated current output of the single stage AC input boost converter 500.

A separate diode-coupled path containing a diode 65 may exist between a rectified AC mains voltage, provided by a full diode bridge 38, and an output capacitor 50. The separate diode-coupled path may provide for a fast partial charge up upon start-up. Upon start-up, the output capacitor 50 voltage may be less than the rectified mains voltage. The forward biasing of the diode 65 may quickly charge the output capacitor 50 to the rectified mains voltage. Thereafter, the voltage across the output capacitor 50 may be increased to the regulated level and the diode 65 may become reverse biased.

An input power supply may be an AC mains voltage 34. A fuse 36 may couple the AC mains voltage 34 to the full diode bridge 38 to rectify the voltage. The rectified AC voltage may be smoothed by an input capacitor 40.

A DC voltage $V_{cc}$ may be supplied to a package pin, such as a DIP-8 or SO-8 terminal at terminal 8 of the controller 200 for powering the chip. The controller 200 may include a voltage regulator to power the internal circuitry.

After leaving the full diode bridge 38, the rectified voltage may be applied to a primary winding 42 (i.e., inductor) of a transformer. The voltage passing through a secondary winding 44 of the transformer may be detected for a zero current crossing in the primary winding 42. This may indicate that the primary winding 42 has depleted its stored energy. The detected voltage signal may be applied to a zero crossing detector (ZCD) pin 5 of the controller.

The controller 200 may turn on a power switching transistor 46 when the zero crossing current is detected. The turning on of the switching transistor 46 may couple the right end of the primary winding 42 to a ground in order to recharge the primary winding 42. The switching transistor 46 may be turned off when a voltage signal proportional to the instantaneous switching transistor 46 current, applied to the current sense (CS) pin 4 of the controller 200, crosses a threshold set by the output of a multiplier 14 internal to the controller 200. This turn-on and turn-off cycle may repeat. The duty cycle (i.e., on time/cycle time) may be what is required to keep an input of an error amplifier 12, which may be internal to the controller 200, at 2.5 V.

When the switching transistor 46 turns off, the right end of the primary winding 42 may rise to forward bias a diode 48 to charge the output capacitor 50 to supply a DC output voltage to the load. The switching frequency of the switching transistor 46 may be determined by the self-oscillation. The switching frequency may be over 10 kHz.

Instead of a resistor divider (shown in FIG. 1) connected across the DC voltage output of the output capacitor 50, where the selection of the resistors generates exactly 2.5 volts at the target output voltage, feedback voltage may be obtained from the output of the differential amplifier 60. The feedback voltage may be applied to the INV pin 1 of the controller. From the INV pin 1, the feedback voltage may be sent to the inverting input port of the error amplifier 12.

An anode end of the series string of LEDs 32A-32N may be connected to the top terminal of the output capacitor 50. A low value sense resistor 54 may be connected between the cathode end of the series string of LEDs 32A-32N and a ground. The voltage across the low value sense resistor 54 may be proportional to the current through the series string of LEDs 32A-32N, which may be related to the brightness level. The top node of the low value sense resistor 54 may be coupled to a non-inverting input of the differential amplifier 60, which may amplify the voltage difference between the voltage from the low value sense resistor 54 and a reference dimming voltage at its inputs. The differential amplifier 60 may also be connected as an operational amplifier (not shown).

The inverting input of the differential amplifier 60 may be connected to a variable voltage source dim controller 62, which may output a dimming voltage $V_{dim}$. The level of $V_{dim}$ may be controlled by a user controlled input of the dimming controller 64.

In order to achieve a steady state regulation of the current supplied to the series string of LEDs 32A-32N, the output of the differential amplifier 60 may be 2.5 volts. This may ensure that the inputs into the error amplifier 12 match. Due to the high gain of the differential amplifier 60, the $V_{dim}$ signal and the voltage across the low value sense resistor 54 may be approximately matched when a target current is generated and supplied to the series string of LEDs 32A-32N. In this way, the level of $V_{dim}$, supplied by the dim controller 64 may control the brightness of the series string of LEDs 32A-32N while using the conventional controller 200 in the single stage AC input boost converter 500.

Figure 6:
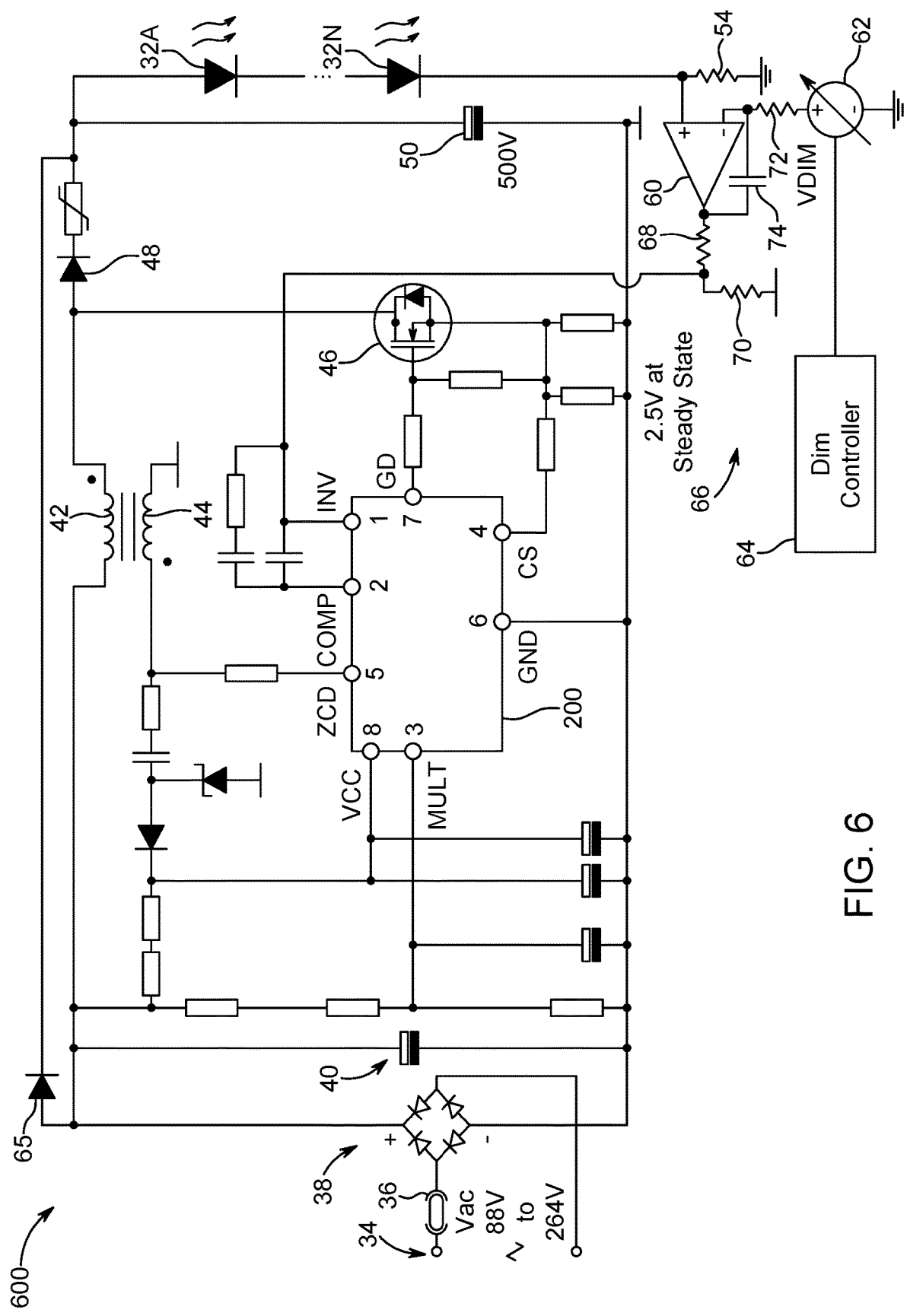
FIG. 6 is a circuit diagram of a single stage AC input boost converter configured with a controller and a second dimming circuit.

Referring now to FIG. 6, a circuit diagram of a single stage AC input boost converter 600 configured with the controller 200 and a second dimming circuit 66 is shown. The circuit diagram may illustrate aspects of a typical application circuit that produces a driving current based on an input of a wide-range mains voltage. It should be noted that well-known structures, including one or more resistors, diodes, and capacitors, and processing steps have not been described in detail in order to avoid obscuring the embodiments described herein.

The single stage AC input boost converter 600 may directly drive and dim the series string of LEDs 32A-32N. The single stage AC input boost converter 600 may be similar to the single stage AC input boost converter described above with reference to FIG. 5. However, the second dimming circuit 66 may include a resistor divider, including resistor 68 and resistor 70, to match the voltage range of the output of the differential amplifier 60 and the INV pin 1 of the controller 200. A resistor 72 and a capacitor 74 may provide frequency compensation for a more stable operation of the negative feedback system to avoid oscillation.

Figure 7:
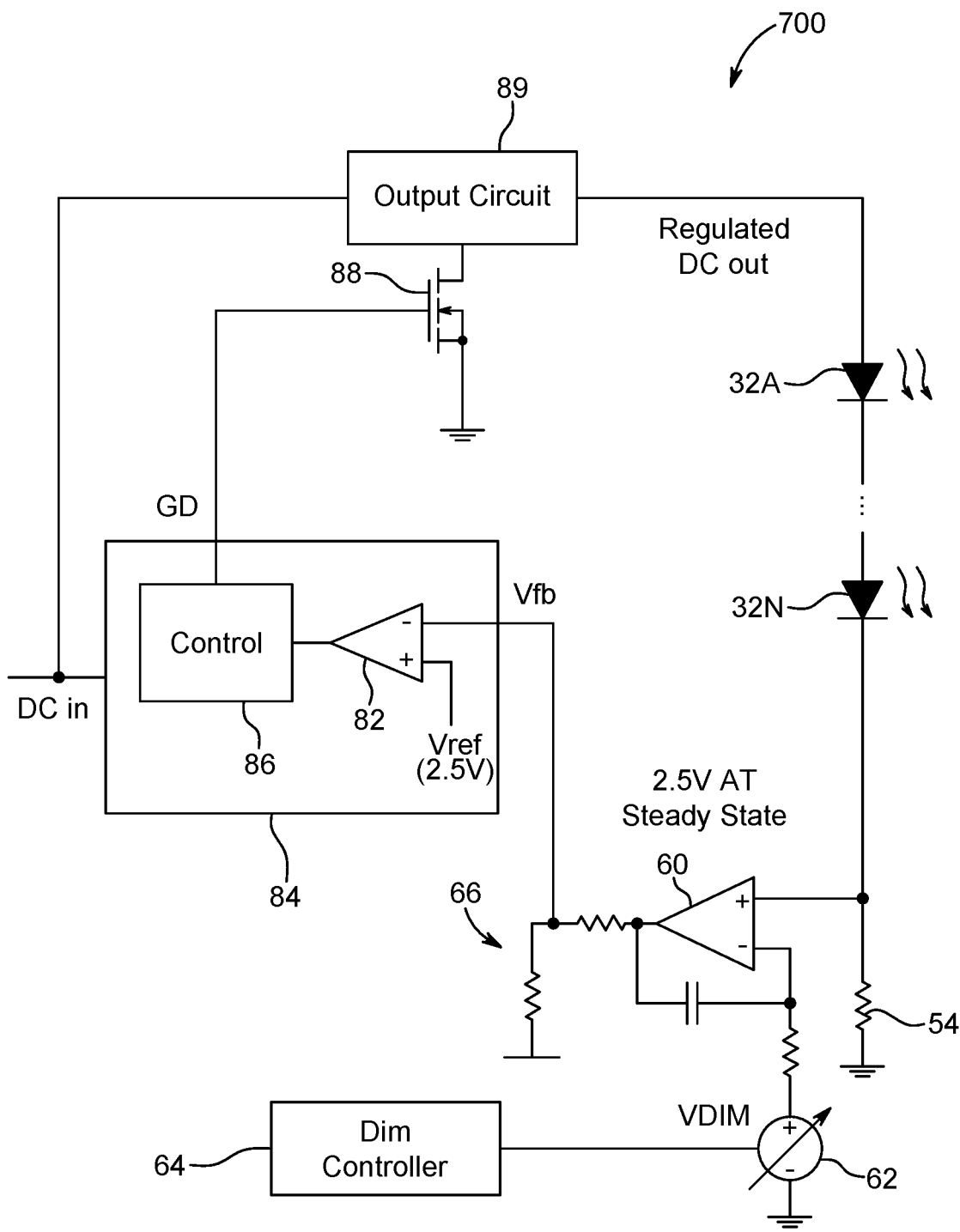
FIG. 7 is a circuit diagram illustrating a generic converter circuit with a dimming function.

Referring now to FIG. 7, a circuit diagram illustrating a generic converter circuit 700 with a dimming function is shown. The generic converter circuit 700 may include an IC 84 with an error amplifier 82 and a fixed voltage reference source generating Vref, which may be augmented with a dimming capability. The generic converter circuit 700 may include the second dimming circuit 66. An on-chip controller 86 controls the duty cycle of a switching transistor 88 to achieve a regulated current through the series string of LEDs 32A-32N. The controller 86 may be similar to the controller 200 described above with reference to FIG. 2. The controller 86 may use at least the feedback from a differential amplifier 60 and an error amplifier 82 to keep the inputs into the error amplifier 82 equal (e.g., 2.5 volts). The controller 86 may use self-oscillation or an on-chip oscillator to control the switching frequency of a switching transistor. An output circuit 89 may contain a conventional inductor/capacitor/diode circuit commonly used in a boost configuration. It should be noted that other configurations may be used.

Although an input port of the differential amplifier 60 is shown directly coupled to the current sense resistor 54, there may be other components that create a proportional signal applied to the amplifier 60. The switching transistor may be internal or external to the IC 84.

The embodiments described above may be used with a non-boost converter configuration, such as, for example, a buck configuration or a buck-boost configuration. Accordingly, a conventional converter controller IC that may not have a dimming function due to the error amplifier and fixed voltage reference being on-chip may be augmented to provide a dimming function. The conventional converter controller IC may be configured as an LED driver outputting a regulated and controllable current.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:
1. A light-emitting diode (LED) driver comprising:
a first circuit configured to receive a voltage from one or more LEDs and a user-controlled variable dimming voltage and provide a first output voltage;
a second circuit electrically coupled to the first circuit, the second circuit configured to receive a fixed reference voltage and the first output voltage and provide a second output voltage based thereon;
a driver circuit coupled to the second circuit and comprising a switch, the driver circuit configured to provide a driving current for the one or more LEDs having a magnitude based on a pulse width modulation (PWM) signal supplied to a control terminal of the switch, a duty cycle of the PWM signal set to control a magnitude of the driving current based on the second output voltage such that the voltage from the one or more LEDs matches the variable dimming voltage;

a rectifier disposed at an input of the LED driver and configured to convert an input alternating current (AC) mains voltage supplied thereto to a rectified voltage; and a bypass diode having:
an input configured to receive the rectified voltage, and
an output coupled to the one or more LEDs and to an output capacitor coupled to ground,
the bypass diode being forward biased when a voltage of the output capacitor is less than the rectified voltage, the output capacitor being charged when the bypass diode is forward biased, the bypass diode being reverse biased when the output capacitor reaches a regulated voltage.

2. The LED driver of claim 1, wherein the first output voltage has a magnitude based on a difference between the voltage from the one or more LEDs and the variable dimming voltage.

3. The LED driver of claim 1, further comprising an input configured for electrical connection to a device that provides the dimming voltage.

4. The LED driver of claim 1, wherein the second output voltage is based on a difference between the first output voltage and the fixed reference voltage.

5. The LED driver of claim 1, wherein the magnitude of the driving current is based on the second output voltage.

6. The LED driver of claim 1, wherein the first circuit is electrically coupled to a sense resistor to sense the voltage from the one or more LEDs.

7. The LED driver of claim 1, wherein the magnitude of the driving current controls a brightness of the one or more LEDs.

8. The LED driver of claim 1, further comprising:
a transformer having an input configured to receive the rectified voltage; and
a main diode connected in series with the transformer, the main diode having:
an input coupled to an output of the transformer, and with the switch, and
an output coupled to the one or more LEDs,
the transformer and main diode connected in parallel with the bypass diode.

9. The LED driver of claim 1, further comprising a circuit element having an input configured to receive the rectified voltage and an output coupled with the switch, the circuit element connected in parallel with the bypass diode and selected from a set of circuit elements that include a transformer and an inductor.

10. The LED driver of claim 1, wherein the second circuit is contained in an integrated circuit.

11. A light-emitting diode (LED) lighting system comprising:
a boost converter configured to be electrically coupled to one or more light emitting diodes (LEDs), the boost converter configured to:
receive an input voltage and a voltage from the one or more LEDs and a user-controlled variable dimming voltage,
generate a first output voltage based on a difference between the voltage from the one or more LEDs and the variable dimming voltage,
receive the first output voltage and a reference voltage and provide a second output voltage based on a difference between the first output voltage and the fixed reference voltage, and
provide a driving current to the one or more LEDs using a driver circuit such that the voltage from the one or more LEDs matches the variable dimming voltage, the driver circuit electrically coupled to the controller to receive the second output voltage and provide the driving current based thereon; and
a rectifier disposed at an input of the driver circuit and configured to convert an input alternating current (AC) mains voltage supplied thereto to a rectified voltage as the input voltage,
the boost converter further comprising:
an output capacitor coupled to ground, and
a bypass diode, the bypass diode having:
an input configured to receive the rectified voltage, and
an output configured to be coupled to the one or more LEDs and to the output capacitor,
the bypass diode being forward biased when a voltage of the output capacitor is less than the rectified voltage, the output capacitor being charged when the bypass diode is forward biased, the bypass diode being reverse biased when the output capacitor reaches a regulated voltage.

12. The system of claim 11, wherein the driving current controls a brightness of the one or more LEDs.

13. The system of claim 11, wherein the one or more LEDs comprise multi junction LEDs connected in series.

14. The system of claim 11, further comprising the one or more LEDs.

15. The system of claim 11, further comprising an input terminal configured for electrical connection to a device that provides the variable dimming voltage.

* * * * *